United States Patent
Tsukikawa

(10) Patent No.: US 6,700,406 B1
(45) Date of Patent: Mar. 2, 2004

(54) MULTI-VALUED LOGICAL CIRCUIT WITH LESS LATCH-UP

(75) Inventor: Yasuhiko Tsukikawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 37 days.

(21) Appl. No.: 10/176,053

(22) Filed: Jun. 21, 2002

(30) Foreign Application Priority Data

Jan. 7, 2002 (JP) ........................................ 2002-000598

(51) Int. Cl.[7] .............................................. H03K 19/00
(52) U.S. Cl. .......................................... 326/59; 326/60
(58) Field of Search .............................. 326/59, 60, 81, 326/83, 112, 119, 121

(56) References Cited

U.S. PATENT DOCUMENTS

| | | | | |
|---|---|---|---|---|
| 4,408,135 A | * | 10/1983 | Yuyama et al. | ............... 326/60 |
| 4,518,875 A | * | 5/1985 | Aytac | .......................... 326/59 |
| 5,479,114 A | * | 12/1995 | Miura | .......................... 326/60 |

FOREIGN PATENT DOCUMENTS

| | | |
|---|---|---|
| JP | 55-514 | 1/1980 |
| JP | 03185923 | 8/1991 |

* cited by examiner

*Primary Examiner*—Vibol Tan
(74) *Attorney, Agent, or Firm*—McDermott, Will & Emery

(57) ABSTRACT

This three-valued inverter includes first and second P-channel MOS transistors connected in series between a line of a first power supply potential and an output node, and each having a gate receiving a first signal; third and fourth P-channel MOS transistors connected in series between a line of a second power supply potential and the output node, and each having a gate receiving a second signal; and an N-channel MOS transistor connected between the output node and a line of a ground potential, and having a gate receiving a third signal. Back gates of the first and third P-channel MOS transistors are applied with the first power supply potential and the second power supply potential, respectively, and back gates of the second and fourth P-channel MOS transistors are both connected to the output node. Therefore, even in a power-up period or the like, no latch-up occurs.

5 Claims, 8 Drawing Sheets

|  | 1 | 2 | 3 |
|---|---|---|---|
| VA | VSS | VDD' | VDD' |
| VB | VDD' | VSS | VDD' |
| VC | VSS | VSS | VDD' (or VDD) |
| VO | VDD | VDD' | VSS |

|     | 1    | 2    | 3             |
|-----|------|------|---------------|
| VA1 | VSS  | VDD' | VDD'          |
| VA2 | VSS  | VDD' | VDD'          |
| VB1 | VDD' | VSS  | VDD'          |
| VB2 | VDD' | VSS  | VDD'          |
| VC1 | VSS  | VSS  | VDD' (or VDD) |
| VC2 | VSS  | VSS  | VDD' (or VDD) |
| VO  | VDD  | VDD' | VSS           |

FIG.9

|  | 1 | 2 | 3 |
|---|---|---|---|
| VA1 | VSS | VDD' | VDD' |
| VA2 | VSS | VDD' | VDD' |
| VA3=VA1+VA2 | VSS | VDD' | VDD' |
| VB1 | VDD' | VSS | VDD' |
| VB2 | VDD' | VSS | VDD' |
| VB3=VB1+VB2 | VDD' | VSS | VDD' |
| VC1 | VSS | VSS | VDD' (or VDD) |
| VC2 | VSS | VSS | VDD' (or VDD) |
| VO | VDD | VDD' | VSS |

|   | 1 | 2 | 3 |
|---|---|---|---|
| VA | VSS | VDD' | VDD' |
| VB | VDD' | VSS | VDD' |
| VC | VSS | VSS | VDD' (or VDD) |
| VO | VDD | VDD' | VSS |

FIG.12 PRIOR ART
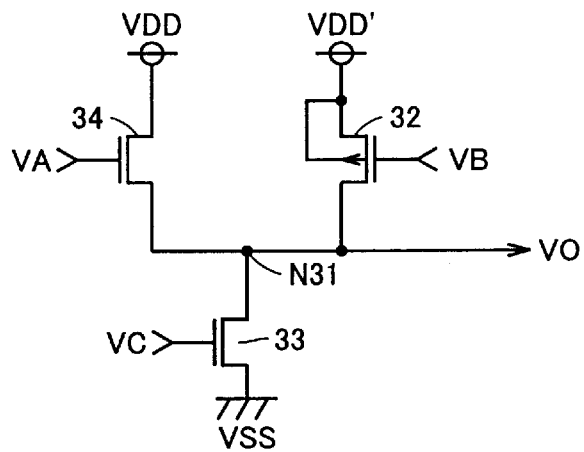
FIG.13 PRIOR ART
|  | 1 | 2 | 3 |
|---|---|---|---|
| VA | VDD' | VSS | VSS |
| VB | VDD' | VSS | VDD' |
| VC | VSS | VSS | VDD' (or VDD) |
| VO | VDD | VDD' | VSS |
FIG.14 PRIOR ART
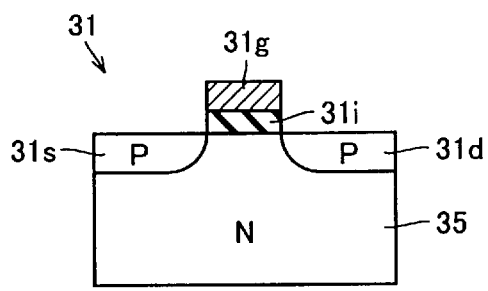

MULTI-VALUED LOGICAL CIRCUIT WITH LESS LATCH-UP

BACKGROUND OF THE INVENTION

1. Field of the Invention

The present invention relates to a multi-valued logical circuit, and particularly to a multi-valued logical circuit which outputs one of a plurality of power supply potentials and a reference potential to an output node in response to a plurality of input signals.

2. Description of the Background Art

A multi-valued logical gate which outputs a logical level other than "H" and "L" levels in addition to a binary logical circuit which outputs an "H" or "L" level is conventionally mounted on a semiconductor integrated circuit.

FIG. 10 is a circuit diagram which shows a conventional three-valued inverter. In FIG. 10, this three-valued inverter includes P-channel MOS transistors 31 and 32 and an N-channel MOS transistor 33. P-channel MOS transistor 31 is connected between the line of a first power supply potential VDD (e.g., 3.0V) and an output node N31 and the gate thereof receives a signal VA. P-channel MOS transistor 32 is connected between the line of a second power supply potential VDD' (e.g., 3.5V) and output node N31 and the gate thereof receives a signal VB. N-channel MOS transistor 33 is connected between output node N31 and the line of a ground potential VSS (0V) and the gate thereof receives a signal VC. The back gates of P-channel MOS transistors 31 and 32 are both connected to the line of second power supply potential VDD'.

FIG. 11 is a view which shows the operation of the three-valued inverter shown in FIG. 10. In FIG. 11, in a state 1, the potentials of signals VA, VB and VC are set at ground potential VSS, second power supply potential VDD' and ground potential VSS, respectively. As a result, P-channel MOS transistor 31 becomes conductive, P-channel MOS transistor 32 and N-channel MOS transistor 33 become nonconductive and the potential of an output signal VO becomes first power supply potential VDD.

In a state 2, the potentials of signals VA, VB and VC are set at second power supply potential VDD', ground potential VSS and ground potential VSS, respectively. As a result, P-channel MOS transistor 32 becomes conductive, P-channel MOS transistor 31 and N-channel MOS transistor 33 become nonconductive and the potential of output signal VO becomes second power supply potential VDD'.

In a state 3, the potentials of signals VA, VB and VC are all set at second power supply potential VDD'. As a result, P-channel MOS transistors 31 and 32 become nonconductive, N-channel MOS transistor 33 becomes conductive and the potential of output signal VO becomes ground potential VSS. It is noted that the same result can be obtained even if the potentials of signals VA and VB are both set at second power supply potential VDD' and the potential of signal VC is set at first power supply potential VDD. As can be seen, this three-valued inverter can selectively output one of the three logical levels of first power supply potential VDD, second power supply potential VDD' and ground potential VSS.

FIG. 12 is a circuit diagram which shows the configuration of another conventional three-valued inverter. Referring to FIG. 12, this three-valued inverter differs from that shown in FIG. 10 in that P-channel MOS transistor 31 is replaced by an N-channel MOS transistor 34. That is, N-channel MOS transistor 34 is connected between the line of first power supply potential VDD and output node N31 and the gate thereof receives signal VA.

FIG. 13 is a view which shows the operation of the three-valued inverter shown in FIG. 12. In FIG. 13, in state 1, the potentials of signals VA, VB and VC are set at second power supply potential VDD', second power supply potential VDD' and ground potential VSS, respectively. As a result, N-channel MOS transistor 34 becomes conductive, P-channel MOS transistor 32 and N-channel MOS transistor 33 become nonconductive and the potential of output signal VO becomes first power supply potential VDD.

In state 2, the potentials of signals VA, VB and VC are all set at ground potential VSS. As a result, P-channel MOS transistor 32 becomes conductive, N-channel MOS transistors 34 and 33 become nonconductive and the potential of output signal VO becomes second power supply potential VDD'.

In state 3, the potentials of signals VA, VB and VC are set at ground potential VSS, second power supply potential VDD' and second power supply potential VDD', respectively. As a result, N-channel MOS transistor 33 becomes conductive, N-channel MOS transistor 34 and P-channel MOS transistor 32 become nonconductive and the potential of output signal VO becomes ground potential VSS. It is noted that the same result can be obtained even if the potentials of signals VA, VB and VC are set at ground potential VSS, second power supply potential VDD' and first power supply potential VDD, respectively.

Meanwhile, in case of the three-valued inverter shown in FIG. 10, not first power supply potential VDD but second power supply potential VDD' is applied to the back gate of P-channel MOS transistor 31 for the following reason. If first power supply potential VDD is applied to the back gate of P-channel MOS transistor 31, the potential of the drain of P-channel MOS transistor 31 becomes second power supply potential VDD', the PN junction between the drain and the back gate of P-channel MOS transistor 31 is directed in a forward direction and high current is carried to thereby cause latch-up in state 2 shown in FIG. 11. It is noted that P-channel MOS transistor 31 is constituted, as shown in FIG. 14, so that a gate electrode 31g is formed on the surface of an N type substrate 35 through a gate insulating film 31i and a P type source region 31s and a P type drain region 31d are formed on one side and the other side of gate electrode 31g, respectively. Gate electrode 31g, source region 31s, drain region 31d and N type substrate 35 become the gate, source, drain and back gate of P-channel MOS transistor 31, respectively.

In the three-valued inverter shown in FIG. 10, however, different power supply potentials VDD and VDD' are applied to the source and the back gate of P-channel MOS transistor 31, respectively. Due to this, if power supply potentials VDD and VDD' become VDD>VDD' in a transient period before power supply potentials VDD and VDD' reach normal potentials during a power-up period or the like, the PN junction between the source and the back gate of P-channel MOS transistor 31 is directed in the forward direction and latch-up may possibly occur.

On the other hand, in the three-valued inverter shown in FIG. 12, since P-channel MOS transistor 31 is replaced by N-channel MOS transistor 34, latch-up does not occur during a power-up period described above. However, in state 1 shown in FIG. 13, the potential of the drain of N-channel MOS transistor 31 becomes first power supply potential VDD=3V, the potential of the gate thereof becomes second power supply potential VDD'=3.5V and N-channel MOS transistor 34 is source-follower connected. Due to this, the potential of the source of N-channel MOS transistor 34, i.e., the potential of output signal VO cannot be higher than a potential VDD'=Vth obtained by subtracting the threshold voltage Vth of N-channel MOS transistor 34 from gate potential VDD' of N-channel MOS transistor 34. If threshold voltage Vth is, for example, not higher than 0.5V, the potential of output signal VO becomes VO=VDD=3V. However, if threshold voltage Vth is higher than 0.5V, the potential of output signal VO becomes VO=VDD'-Vth<VDD=3V, i.e., lower than VDD.

SUMMARY OF THE INVENTION

It is, therefore, the main object of the present invention to provide a multi-valued logical circuit wherein no latch-up occurs and an output potential is not lowered by as much as the threshold voltage of a transistor.

A multi-valued logical circuit according to this invention includes: a first transistor of a first conductive type provided to correspond to each power supply potential, having both a first electrode and a substrate electrode receiving the corresponding power supply potential, and becoming conductive in response to input of the corresponding signal; a second transistor of the first conductive type provided to correspond to each power supply potential, having a first electrode connected to a second electrode of the first transistor, having both a second electrode and a substrate electrode connected to the output node, and becoming conductive in response to the input of the corresponding signal; and a third transistor of a second conductive type having a first electrode connected to the output node, having a second electrode receiving the reference potential, and becoming conductive in response to the input of the $N^{th}$ signal. Since the first electrode and the substrate electrode of the first transistor are both connected to the corresponding power supply potential line, no latch-up occurs during a power-up period or the like. In addition, the first and second transistors are connected in series. Due to this, even if the potential of the output node differs from the corresponding power supply potential, the node between the first and second transistors turns into a floating state and no latch-up occurs. Further, since only the transistors of the first conductive type are used for outputting power supply potentials, an output potential is not lowered by as much as the threshold voltage of the transistor of the second conductive type.

In addition, another multi-valued logical circuit according to this invention includes: a first switching circuit provided to correspond to each power supply potential, and applying the corresponding power supply potential to the output node in response to input of at least one first signal among a plurality of first signals included in the corresponding signal group; and a second switching circuit applying the reference potential to the output node in response to the input of all plurality of second signals included in the $N^{th}$ signal group. The first switching circuit includes: a first transistor of a first conductive type provided to correspond to each first signal included in the corresponding signal group, having both a first electrode and a substrate electrode receiving the corresponding power supply potential, and becoming conductive in response to the input of the corresponding first signal; and a second transistor of the first conductive type provided to correspond to each first signal included in the corresponding signal group, having a first electrode connected to a second electrode of the first transistor, having a second electrode and a substrate electrode both connected to the output node, and each becoming conductive in response to the input of the corresponding first signal. The second switching circuit includes a plurality of third transistors of a second conductive type connected in series between the output node and a line of the reference potential, becoming conductive in response to the input of the plurality of second signals included in the $N^{th}$ signal group, respectively. In this case, it is possible to constitute a multi-valued NAND gate to which no latch-up occurs and the output potential of which is not lowered by as much as the threshold voltage of the transistor.

Furthermore, yet another multi-valued logical circuit according to this invention includes: a first switching circuit provided to correspond to each power supply potential, and applying the corresponding power supply potential to the output node in response to input of all a plurality of first signals included in the corresponding signal group; and a second switching circuit applying the reference potential to the output node in response to the input of at least one second signal among a plurality of second signals included in the $N^{th}$ signal group. The first switching circuit includes: a first transistor of a first conductive type having a first electrode and a substrate electrode both connected to the output node, and becoming conductive in response to the input of at least one signal among the plurality of first signals included in the corresponding signal group; and a plurality of second transistors of the first conductive type connected in series between a second electrode of the first transistor and a line of the corresponding potential, and becoming conductive in response to the input of the plurality of first signals respectively. The second switching circuit includes a plurality of third transistors of a second conductive type connected in parallel between the output node and a line of the reference potential, and becoming conductive in response to the input of the plurality of second signals respectively. In this case, it is possible to constitute a multi-valued NOR gate to which no latch-up occur and the output potential of which is not lowered by as much as the threshold voltage of the transistor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a view which shows a part of the operation of the three-valued NOR gate shown in FIG. 8;

FIG. 12 is a circuit diagram which shows the configuration of another conventional three-valued inverter;

FIG. 13 is a view which shows the operation of the three-valued inverter shown in FIG. 12; and FIG. 14 is a view which explains the problems of the conventional three-valued inverter shown in FIG. 10.

DESCRIPTION OF THE PREFERRED EMBODIMENTS

First Embodiment

Figures 1, 2:
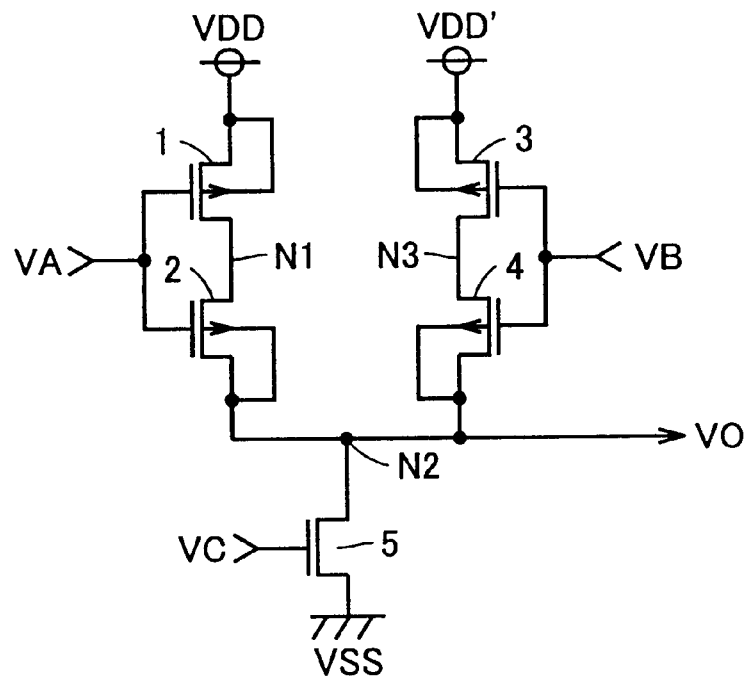
FIG. 1 is a circuit diagram which shows the configuration of a three-valued inverter according to the first embodiment of the present invention.
FIG. 2 is a view which shows the operation of the three-valued inverter shown in FIG. 1.

FIG. 1 is a circuit diagram which shows the configuration of a three-valued inverter according to the first embodiment of the present invention. In FIG. 1, this three-valued inverter includes P-channel MOS transistors 1 to 4 and an N-channel MOS transistor 5. P-channel MOS transistors 1 and 2 are connected in series between the line of first power supply potential VDD (e.g., 3.0V) and an output node N2 and each gate thereof receives signal VA. P-channel MOS transistors 3 and 4 are connected in series between the line of second power supply potential VDD' (e.g., 3.5V) and output node N2 and each gates thereof receives signal VB.

The back gate of P-channel MOS transistor 1 is connected to the line of first power supply potential VDD, the back gate of P-channel MOS transistor 3 is connected to the line of second power supply potential VDD' and the back gates of P-channel MOS transistors 2 and 4 are both connected to output node N2. N-channel MOS transistor 5 is connected between output node N2 and the line of ground potential VSS and the gate thereof receives signal VC.

FIG. 2 is a view which shows the operation of the three-valued inverter shown in FIG. 1. In FIG. 2, in state 1, the potentials of signals VA, VB and VC are set at ground potential VSS, second power supply potential VDD' and ground potential VSS, respectively. As a result, P-channel MOS transistors 1 and 2 become conductive, P-channel MOS transistor 3 and 4 and N-channel MOS transistor 5 become nonconductive and the potential of output signal VO becomes first power supply potential VDD.

In state 2, the potentials of signals VA, VB and VC are set at second power supply potential VDD', ground supply potential VSS and ground potential VSS, respectively. As a result, P-channel MOS transistors 3 and 4 become conductive, P-channel MOS transistors 1 and 2 and N-channel MOS transistor 5 become nonconductive and the potential of output signal VO becomes second power supply potential VDD'. At this moment, since P-channel MOS transistor 2 is nonconductive, the potential of a node N1 between P-channel MOS transistors 1 and 2 does not become potential VDD' of output node N2 but turns into a floating state. Therefore, the PN junction between the drain and the back gate of P-channel MOS transistor 1 is not directed in the forward direction and no latch-up occurs.

In state 3, the potentials of signals VA, VB and VC are all set at second power supply potential VDD'. As a result, P-channel MOS transistors 1 to 4 become nonconductive, N-channel MOS transistor 5 becomes conductive and the potential of output signal VO becomes ground potential VSS. At this moment, since the potentials of the back gates of P-channel MOS transistors 2 and 4 are both ground potential but P-channel MOS transistors 1 and 3 are nonconductive, both the potential of node N1 between P-channel MOS transistors 1 and 2 and that of a node N3 between P-channel MOS transistors 3 and 4 turn into a floating state. Therefore, the PN junction between the source and the back gate of P-channel MOS transistor 2 and that between the source and the back gate of P-channel MOS transistor 4 are not directed in the forward direction and no latch-up occurs. It is noted that the same result can be obtained even if the potentials of signals VA, VB and VC are set at second power supply potential VDD', second power supply potential VDD' and first power supply potential VDD, respectively.

Further, the source and the back gate of P-channel MOS transistor 1 are both connected to the line of first power supply potential VDD and the source and the back gate of P-channel MOS transistor 3 are both connected to the line of second power supply potential VDD'. Therefore, irrespectively of the relationship in magnitude between first power supply potential VDD and second power supply potential VDD' during a power-up period, the PN junction between the source and the back gate of P-channel MOS transistor 1 and that of P-channel MOS transistor 3 are not directed in the forward direction and no latch-up occurs.

In addition, since P-channel MOS transistors 1 to 4 are employed as pull-up transistors, no output voltage loss occurs due to the threshold voltage of N-channel MOS transistor 34 unlike the three-valued inverter shown in FIG. 12 which employs N-channel MOS transistor 34 as a pull-up transistor.

As described above, according to the first embodiment, it is possible to obtain a three-valued inverter wherein no latch-up occurs during a power-up period or the like and no output voltage loss occurs due to the threshold voltage of a transistor.

Figure 3:
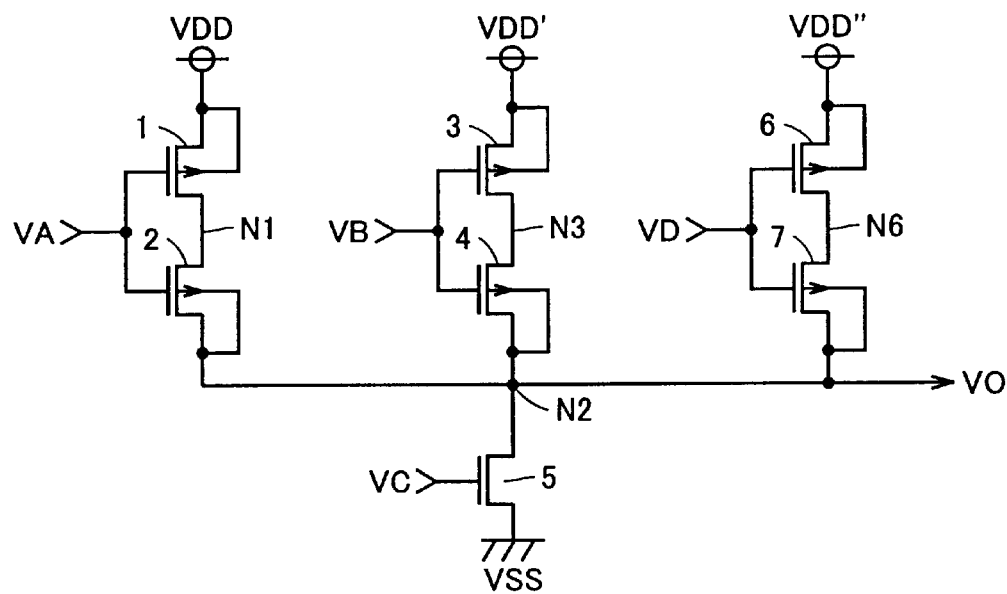
FIG. 3 is a circuit diagram which shows a modification of the first embodiment.

Various modifications of the first embodiment will next be described. In the modification shown in FIG. 3, P-channel MOS transistors 6 and 7 are added to the three-valued inverter shown in FIG. 1. P-channel MOS transistors 6 and 7 are connected in series between the line of a third power supply potential VDD" and output node N2 and each gate thereof receives a signal VD. The potentials of signals VA, VB and VC are set at, for example, third power supply potential VDD", third power supply potential VDD" and ground potential VSS, respectively, thereby making P-channel MOS transistors 1 to 4 and N-channel MOS transistor 5 nonconductive. In addition, the potential of signal VD is set at ground potential VSS, thereby making P-channel MOS transistors 6 and 7 conductive. As a result, the potential of output signal VO can be made third power supply potential VDD". Therefore, this four-level inverter can selectively output one of the four logical levels of first to third power supply potentials VDD, VDD' and VDD" and ground potential VSS. In addition, if the potential of signal VD is set at third power supply potential VDD", a node N6 between P-channel MOS transistors 6 and 7 turns into a floating state. Therefore, the PN junctions of P-channel MOS transistors 6 and 7 are not directed in the forward direction and no latch-up occurs.

Figure 4:
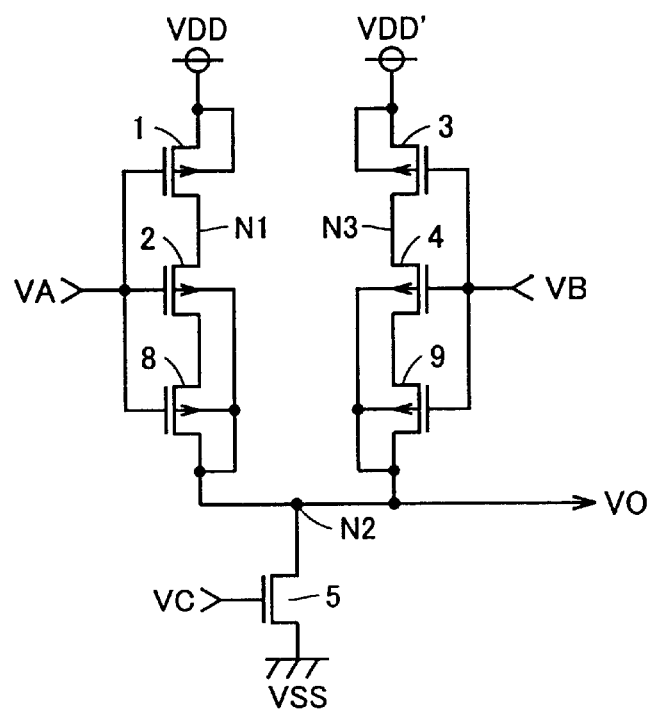
FIG. 4 is a circuit diagram which shows another modification of the first embodiment.

In the modification shown in FIG. 4, P-channel MOS transistors 8 and 9 are added to the three-valued inverter shown in FIG. 1. P-channel MOS transistor 8 is interposed between the drain of P-channel MOS transistor 2 and output node N2, the gate thereof receives signal VA and the back gate thereof is connected to output node N2. P-channel MOS transistor 9 is interposed between the drain of P-channel MOS transistor 4 and output node N2, the gate thereof receives signal VB and the back gate thereof is connected to output node N2. In this modification, in state 2 shown in FIG. 2, two P-channel MOS transistors 2 and 8 are made nonconductive, thereby making it possible to ensure preventing potential VDD' of output node N2 from being transmitted to node N1.

Figure 5:
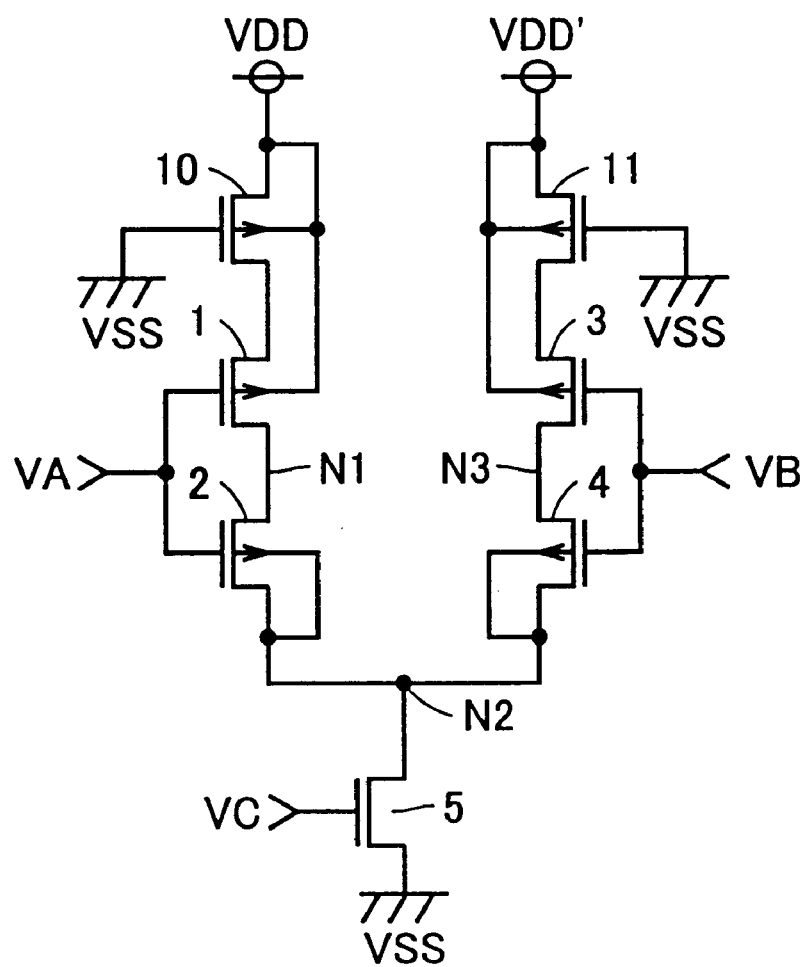
FIG. 5 is a circuit diagram which shows yet another modification of the first embodiment.

In the modification shown in FIG. 5, P-channel MOS transistors 10 and 11 are added to the three-valued inverter shown in FIG. 1. P-channel MOS transistor 10 is interposed between the line of first power supply potential VDD and the source of P-channel MOS transistor 1 and the gate thereof is grounded. P-channel MOS transistor 11 is interposed between the line of second power supply potential VDD' and the source of P-channel MOS transistor 3 and the gate thereof is grounded. P-channel MOS transistors 10 and 11 constitute resistors, respectively. It is, therefore, possible to restrict current carried between first power supply potential VDD and output node N2 and that carried between second power supply potential VDD' and output node N2 to not higher than a predetermined value.

Second Embodiment

Figure 6:
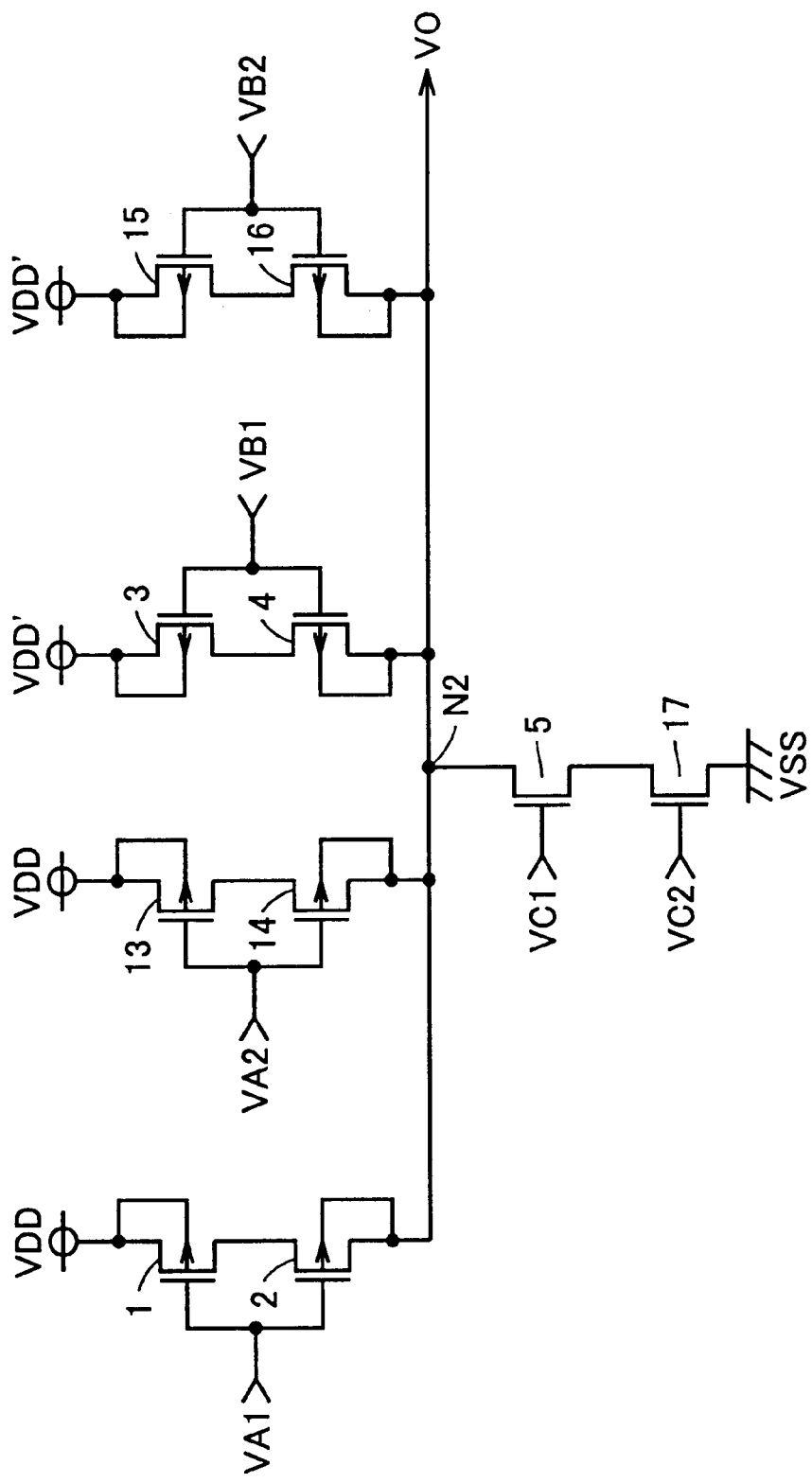
FIG. 6 is a circuit diagram which shows the configuration of a three-valued NAND gate according to the second embodiment of the present invention.

FIG. 6 is a circuit diagram which shows the configuration of a three-valued NAND gate according to the second embodiment of the present invention. Referring to FIG. 6, this three-valued NAND gate differs from the three-valued inverter shown in FIG. 1 in that signals VA, VB and VC are replaced by signals VA1, VB1 and VC1, respectively and P-channel MOS transistors 13 to 16 and an N-channel MOS transistor 17 are added.

P-channel MOS transistors 13 and 14 are connected in series between the line of first power supply potential VDD and output node N2 and each gate thereof receives a signal VA2, respectively. P-channel MOS transistors 15 and 16 are connected in series between the line of second power supply potential VDD' and output node N2 and each gate thereof receives a signal VB2. The back gate of P-channel MOS transistor 13 is connected to first power supply potential VDD, the back gate of P-channel MOS transistor 15 is connected to second power supply potential VDD' and the back gates of P-channel MOS transistors 14 and 16 are both connected to output node N2. N-channel MOS transistor 17 is connected between the source of N-channel MOS transistor 5 and the line of ground potential VSS and the gate thereof receives a signal VC2.

Figures 7, 8:
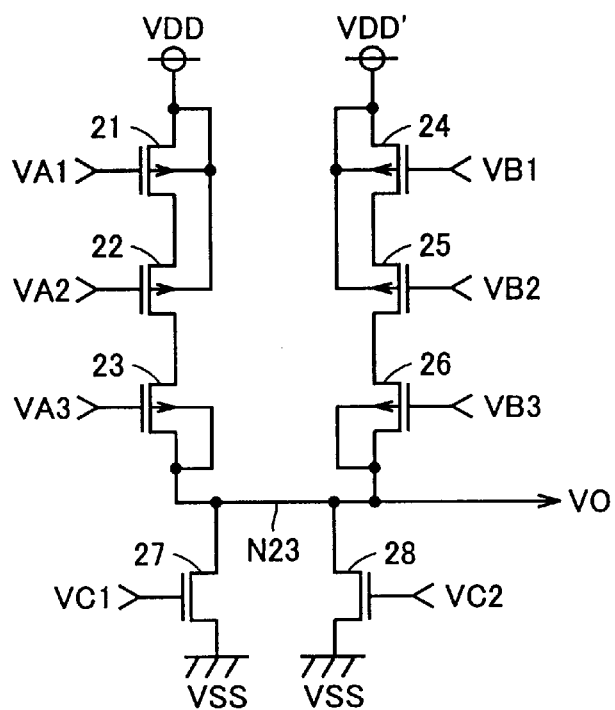
FIG. 7 is a view which shows a part of the operation of the three-valued NAND gate shown in FIG. 6.
FIG. 8 is a circuit diagram which shows the configuration of a three-valued NOR gate according to the third embodiment of the present invention.
Figures 10, 11:
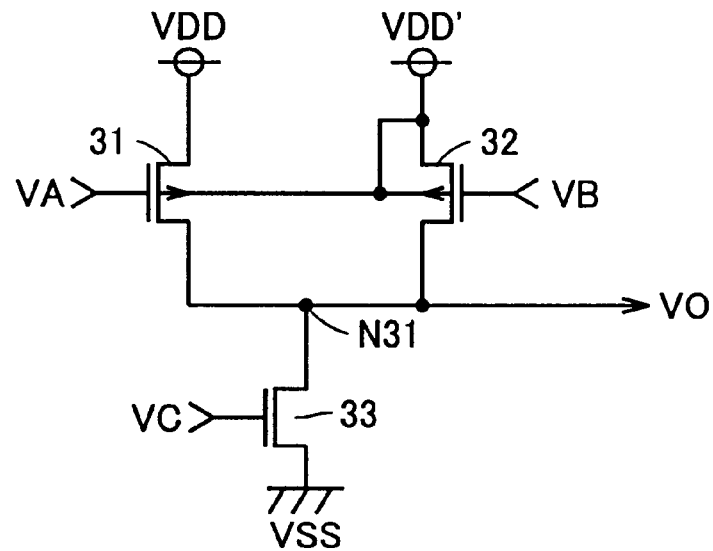
FIG. 10 is a circuit diagram which shows the configuration of a conventional three-valued inverter.
FIG. 11 is a view which shows the operation of the three-valued inverter shown in FIG. 10.

FIG. 7 is a view which shows a part of the operation of the three-valued NAND gate shown in FIG. 6. In state 1, the potentials of signals VA1, VA2, VC1 and VC2 are all set at ground potential VSS and those of signals VB 1 and VB2 are both set at second power supply potential VDD'. As a result, P-channel MOS transistors 3, 4, 15 and 16 and N-channel MOS transistors 5 and 17 become nonconductive, P-channel MOS transistors 1, 2, 13 and 14 become conductive and the potential of output signal VO becomes first power supply potential VDD.

In state 2, the potentials of signals VA1 and VA2 are both set at second power supply potential VDD' and those of signals VB1, VB2, VC1 and VC2 are all set at ground potential VSS. As a result, P-channel MOS transistors 1, 2, 13 and 14 and N-channel MOS transistors 5 and 17 become nonconductive, P-channel MOS transistors 3, 4, 15 and 16 become conductive and the potential of output signal VO becomes second power supply potential VDD'.

In state 3, the potentials of signals VA1, VA2, VB1, VB2, VC1 and VC2 are all set at second power supply potential VDD'. As a result, P-channel MOS transistors 1 to 4 and 13 to 16 become nonconductive, N-channel MOS transistors 5 and 17 become conductive, and the potential of output signal VO becomes ground potential VSS. The same result can be obtained even if the potentials of signals VA1, VA2, VB1 and VB2 are all set at second power supply potential VDD' and those of signals VC1 and VC2 are both set at first power supply potential VDD.

Third Embodiment

FIG. 8 is a circuit diagram which shows the configuration of a three-valued NOR gate according to the third embodiment of the present invention. In FIG. 8, this three-valued NOR gate includes P-channel MOS transistors 21 to 26 and N-channel MOS transistors 27 and 28. P-channel MOS transistors 21 to 23 are connected in series between the line of first power supply potential VDD and an output node N23 and the gates thereof receive signals VA1, VA2 and VA3, respectively. Signal VA3 is the logical OR signal between signals VA1 and VA2.

P-channel MOS transistors 24 to 26 are connected in series between the line of second power supply potential VDD' and output node N23 and the gates thereof receive signals VB1, VB2 and VB3, respectively. Signal VB3 is a logical OR signal between signals VB1 and VB2. The back gates of P-channel MOS transistors 21 and 22 are both connected to the line of first power supply potential VDD, those of P-channel MOS transistors 24 and 25 are both connected to the line of second power supply potential VDD' and those of P-channel MOS transistors 23 and 26 are both connected to output node N23. N-channel MOS transistors 27 and 28 are connected to the output node N23. N-channel MOS transistors 27 and 28 are connected in parallel between output node N23 and the line of ground potential VSS and the gates thereof receive signals VC1 and VC2, respectively.

FIG. 9 is a view which shows a part of the operation of three-valued NOR gate shown in FIG. 8. In FIG. 9, in state 1, the potentials of signals VA1 to VA3, VC1 and VC2 are all set at ground potential VSS and those of signals VB1 to VB3 are all set at second power supply potential VDD'. As a result, P-channel MOS transistors 21 to 23 become conductive, P-channel MOS transistors 24 to 26 and N-channel MOS transistors 27 and 28 become nonconductive and the potential of output signal VO become first power supply potential VDD.

In state 2, the potentials of signals VA1 to VA3 are all set at second power supply potential VDD' and those of signals VB1 to VB3, VC1 and VC2 are all set at ground potential VSS. As a result, P-channel MOS transistors 24 to 26 become conductive, P-channel MOS transistors 21 to 23 and N-channel MOS transistors 27 and 28 become nonconductive and the potential of output signal VO becomes second power supply potential VDD'.

In state 3, the potentials of signals VA1 to VA3, VB1 to VB3, VC1 and VC2 are all set at second power supply potential VDD'. As a result, P-channel MOS transistors 21 to 26 become nonconductive, N-channel MOS transistors 27 and 28 become conductive and the potential of output signal VO becomes ground potential VSS. The same result can be obtained even if the potentials of signals VA1 to VA3 and VB1 to VB3 are all set at second power supply potential VDD' and those of signals VC1 and VC2 are both set at first power supply potential VDD.

This third embodiment can obtain the same advantage as that of the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multi-valued logical circuit outputting first to $(N-1)^{th}$ power supply potentials, where N is an integer not less than 3, and a reference potential to an output node in response to first to $N^{th}$ signals, respectively, the multi-valued logical circuit comprising:
   a first transistor of a first conductive type provided to correspond to each power supply potential, having both a first electrode and a substrate electrode receiving the corresponding power supply potential, and becoming conductive in response to input of the corresponding signal;
   a second transistor of the first conductive type provided to correspond to each power supply potential, having a first electrode connected to a second electrode of said first transistor, having both a second electrode and a substrate electrode connected to said output node, and becoming conductive in response to the input of the corresponding signal; and
   a third transistor of a second conductive type having a first electrode connected to said output node, having a second electrode receiving said reference potential, and becoming conductive in response to the input of said $N^{th}$ signal.

2. The multi-valued logical circuit according to claim 1, further comprising:
   a fourth transistor of the first conductive type provided to correspond to each power supply potential, interposed between the second electrode of the corresponding second transistor and said output node, having a substrate electrode connected to said output node, and becoming conductive in response to the input of the corresponding signal.

3. The multi-valued logical circuit according to claim 1, further comprising:
   a fifth transistor of the first conductive type provided to correspond to each power supply potential, interposed between a line of the corresponding power supply potential and the first electrode of said first transistor, and having an input electrode receiving said reference potential.

4. A multi-valued logical circuit outputting first to $(N-1)^{th}$ power supply potentials, where N is an integer not smaller than 3, and a reference potential to an output node in response to first to $N^{th}$ signal groups, respectively, each of the signal groups including a plurality of signals, the multi-valued logical circuit comprising:
   a first switching circuit provided to correspond to each power supply potential, and applying the corresponding power supply potential to said output node in response to input of at least one first signal among a plurality of first signals included in the corresponding signal group; and
   a second switching circuit applying said reference potential to said output node in response to the input of all plurality of second signals included in said $N^{th}$ signal group, wherein
   said first switching circuit includes:
      a first transistor of a first conductive type provided to correspond to each first signal included in the corresponding signal group, having both a first electrode and a substrate electrode receiving the corresponding power supply potential, and becoming conductive in response to the input of the corresponding first signal; and
      a second transistor of a first conductive type provided to correspond to each first signal included in the corresponding signal group, having a first electrode connected to a second electrode of said first transistor, having a second electrode and a substrate electrode both connected to said output node, and each becoming conductive in response to the input of the corresponding first signal, and wherein
         said second switching circuit includes:
            a plurality of third transistors of a second conductive type connected in series between said output node and a line of said reference potential, becoming conductive in response to the input of the plurality of second signals included in said $N^{th}$ signal group, respectively.

5. A multi-valued logical circuit outputting first to $(N-1)^{th}$ power supply potentials, where N is an integer not smaller than 3, and a reference potential to an output node in response to first to $N^{th}$ signal groups, respectively, each of the signal groups including a plurality of signals, the multi-valued logical circuit comprising:
   a first switching circuit provided to correspond to each power supply potential, and applying the corresponding power supply potential to said output node in response to input of all a plurality of first signals included in the corresponding signal group; and
   a second switching circuit applying said reference potential to said output node in response to the input of at least one second signal among a plurality of second signals included in said $N^{th}$ signal group, wherein
   said first switching circuit includes:
      a first transistor of a first conductive type having a first electrode and a substrate electrode both connected to said output node, and becoming conductive in response to the input of at least one signal among the plurality of first signals included in the corresponding signal group; and
      a plurality of second transistors of the first conductive type connected in series between a second electrode of said first transistor and a line of the corresponding potential, and becoming conductive in response to the input of said plurality of first signals respectively, and wherein
         said second switching circuit includes:
            a plurality of third transistors of a second conductive type connected in parallel between said output node and a line of said reference potential, and becoming conductive in response to the input of said plurality of second signals respectively.

* * * * *

UNITED STATES PATENT AND TRADEMARK OFFICE
CERTIFICATE OF CORRECTION

PATENT NO. : 6,700,406 B1
DATED : March 2, 2004
INVENTOR(S) : Yasuhiko Tsukikawa It is certified that error appears in the above-identified patent and that said Letters Patent is hereby corrected as shown below:

Title page,
Item [73], Assignee, change "Mitsubishi Denki Kabushiki Kaisha" to -- Renesas Technology, Corp. --.

Signed and Sealed this

Seventh Day of June, 2005

JON W. DUDAS
*Director of the United States Patent and Trademark Office*